US012779550B2

(12) United States Patent
Von Fieandt et al.

(10) Patent No.: US 12,779,550 B2
(45) **Date of Patent: *Nov. 3, 2026**

(54) COATED CUTTING TOOL

(71) Applicant: AB SANDVIK COROMANT, Sandviken (SE)

(72) Inventors: Linus Von Fieandt, Sandviken (SE); Raluca Morjan Brenning, Sandviken (SE); Jan Engqvist, Sandviken (SE)

(73) Assignee: AB Sandvik Coromant, Sandviken (SE)

( * ) Notice: Subject to any disclaimer, the term of this patent is extended or adjusted under 35 U.S.C. 154(b) by 371 days.

This patent is subject to a terminal disclaimer.

(21) Appl. No.: 18/563,259

(22) PCT Filed: May 25, 2022

(86) PCT No.: PCT/EP2022/064142

§ 371 (c)(1),
(2) Date: Nov. 21, 2023

(87) PCT Pub. No.: WO2022/248522

PCT Pub. Date: Dec. 1, 2022

(65) Prior Publication Data

US 2024/0238874 A1 Jul. 18, 2024

(30) Foreign Application Priority Data

May 27, 2021 (EP) .................................... 21176130

(51) Int. Cl.
*B23B 27/14* (2006.01)
*C23C 16/36* (2006.01)
(Continued)

(52) U.S. Cl.
CPC ............ *B23B 27/148* (2013.01); *C23C 16/36* (2013.01); *C23C 16/403* (2013.01);
(Continued)

(58) Field of Classification Search
None
See application file for complete search history.

(56) References Cited

U.S. PATENT DOCUMENTS 6,221,469 B1 * 4/2001 Ruppi .................. C23C 30/005 428/323
2006/0222885 A1 * 10/2006 Fukano ................ C23C 30/005 428/689
(Continued)

FOREIGN PATENT DOCUMENTS

EP 1008673 A1 6/2000
EP 2791387 A1 6/2013
EP 3848485 A1 7/2021

*Primary Examiner* — Seth Dumbris
(74) *Attorney, Agent, or Firm* — Corinne R. Gorski

(57) ABSTRACT

A cutting tool includes a substrate at least partially coated with a coating, the substrate being a cemented carbide, cermet or ceramic. The coating has a layer of Ti(C,N), a layer of $Al_2O_3$ and there between a bonding layer. The Ti(C,N) layer is composed of columnar grains, wherein an average grain size $D_{422}$ of the Ti(C,N) layer is 25-50 nm, and wherein the Ti(C,N) layer includes a portion B1 that is adjacent to the bonding layer. An average grain size of the Ti(C,N) grains in portion B1 is larger than the average grain size $D_{422}$ in the whole Ti(C,N) layer. In the portion B1 of Ti(C,N) layer the Ti(C,N) grains has an average grain size of 130-300 nm.

15 Claims, 5 Drawing Sheets

(51) Int. Cl.
*C23C 16/40* (2006.01)
*C23C 30/00* (2006.01)

(52) U.S. Cl.
CPC ........ *C23C 30/005* (2013.01); *B23B 2224/04* (2013.01); *B23B 2224/32* (2013.01); *B23B 2228/04* (2013.01); *B23B 2228/105* (2013.01); *B23B 2228/36* (2013.01); *B23B 2228/44* (2013.01)

(56) References Cited

U.S. PATENT DOCUMENTS

| | | | | |
|---|---|---|---|---|
| 2014/0017469 | A1* | 1/2014 | Fukunaga | C23C 28/048 428/323 |
| 2014/0287210 | A1 | 9/2014 | Kohei et al. | |
| 2014/0308083 | A1 | 10/2014 | Bjormander | |
| 2016/0175940 | A1* | 6/2016 | Lindahl | C23C 28/048 428/141 |

* cited by examiner

COATED CUTTING TOOL

RELATED APPLICATION DATA

This application is a § 371 National Stage Application of PCT International Application No. PCT/EP2022/064142 filed May 25, 2022, with priority to EP 21176130.9 filed May 27, 2021. This application is related to co-pending U.S. patent application Ser. No. 18/563,571, filed on Nov. 22, 2023, Ser. No. 18/563,474, filed on Nov. 22, 2023, Ser. No. 18/563,612 filed on Nov. 22, 2023, and Ser. No. 17/613,213 filed on Nov. 22, 2021.

TECHNICAL FIELD

The present invention relates to a coated cutting tool comprising a substrate and a coating, wherein the coating is deposited by CVD and comprises a Ti(C,N) layer and an $\alpha$-$Al_2O_3$-layer.

BACKGROUND

In the metal cutting industry coated cutting tools are well known in the art. CVD coated cutting tools and PVD coated cutting tools are the two most dominating types of coated cutting tools. Advantages with these coatings are high resistance to chemical and abrasive wear which are important to achieve long tool life of the coated cutting tool. CVD coatings comprising a layer of Ti(C,N) together with a layer of alumina are known to perform well in for example turning or milling in steel.

EP2791387A1 discloses a coated cutting tool provided with a fine-grained titanium carbonitride layer. The coating is advantageous in showing high resistance to flaking in turning of nodular cast iron and in high speed cutting. A columnar CVD TiCN layer is described with an average grain width of 0.05-0.4 μm.

Recent studies have shown that the combination of a very fine grained Ti(C,N) layer and a $Al_2O_3$ layer sometimes lead to poor adhesion between the Ti(C,N) and the $Al_2O_3$. It is of interest to address this issue as a very fine grained Ti(C,N) has shown promising cutting tool properties.

It is an object of the present invention to provide a coated cutting tool for metal cutting with a high adhesion of the layers of the coating. It is a further object to provide a coated cutting tool with high wear resistance, especially with high resistance to flaking during metal cutting. It is also an object of the present invention to provide a cutting tool with high resistance to crater wear in metal cutting in steel.

SUMMARY OF THE INVENTION

At least one of the above-mentioned objects is achieved by a cutting tool according to claim 1. Preferred embodiments are disclosed in the dependent claims.

The present invention relates to a cutting tool comprising a substrate at least partially coated with a coating, said coating comprising a layer of Ti(C,N), a layer of $Al_2O_3$ and there between a bonding layer, wherein said Ti(C,N) layer with a thickness of 3-25 μm is composed of columnar grains, wherein an average grain size $D_{422}$ of the Ti(C,N) layer is 25-50 nm, as measured with X-ray diffraction with CuKα radiation, the grain size $D_{422}$ is calculated from the full width at half maximum (FWHM) of the (422) peak according to Scherrer's equation:

$$D_{422} = \frac{K\lambda}{B_{422}\cos\theta}$$

wherein $D_{422}$ is the average grain size of the Ti(C,N), K is the shape factor here set at 0.9, λ is the wave length for the CuKα radiation here set at 1.5405 Å, $B_{422}$ is the FWHM value for the (422) reflection and θ is the Bragg angle, wherein the Ti(C,N) layer comprises a portion B1 that is adjacent to the bonding layer, and wherein an average grain size of the Ti(C,N) grains in portion B1 is larger than the average grain size $D_{422}$ over the whole thickness of the Ti(C,N) layer, in the portion B1 of Ti(C,N) layer the Ti(C,N) grains has an average grain size of 130-300 nm as measured with TKD (Transmission Kikuchi Diffraction) in an analysed area of 5×5 μm on a plan view extending in parallel with the substrate surface.

The present invention provides an increased adhesion between a very fine grained Ti(C,N) layer and a $\alpha$-$Al_2O_3$ layer. This increased adhesion is achieved by at the end of the Ti(C,N) deposition change the deposition process conditions so that some of the fine Ti(C,N) grains widens and a more coarse grained Ti(C,N) portion is formed. Thereafter the process conditions are changed again, this time to provide an optimal outer surface of the Ti(C,N) grains. In this way an outermost surface of the Ti(C,N) is formed that is similar to the outermost surface of the coarse grained Ti(C,N) that is known to show high adhesion via the bonding layer to the $\alpha$-$Al_2O_3$ layer. If the average grain size in portion B1 is too small the adhesion to the subsequently deposited $\alpha$-$Al_2O_3$ layer is not increased. The average grain size in portion B1 is suitably smaller than 300 nm since this is advantageous for the wear resistance.

It is difficult to study the grain size of very fine grained Ti(C,N) in SEM since the resolution is limited. Here the average grain size of the fine grained portion of the Ti(C,N) layer is instead defined via XRD and Scherrer's equation. Even though the signal from the XRD also includes information from the coarser grained Ti(C,N) portion B1, this contribution is considered to be limited.

The study of the grain size in the coarse-grained portion B1 on the other hand had the challenges that it is just a portion of the Ti(C,N) layer and therefor a method with a very high precision had to be selected. A plane view study with TKD was selected since the information achieved included both information about the grain size and also information about the orientation of the Ti(C,N) grains at a very local scale.

In one embodiment of the present invention said Ti(C,N) layer in the portion B1 of the Ti(C,N) layer exhibits an orientation as measured with TKD on a plan view of said Ti(C,N) layer extending in parallel with the substrate surface and as measured in an area of at least 5×5 μm, wherein a surface normal of the Ti(C,N) layer is parallel to the surface normal of the substrate surface, wherein ≥93% of the analysed area has a <211> direction within 15 degrees from the surface normal of the Ti(C,N) layer, preferably ≥95%.

A Ti(C,N) layer with a portion with high orientation along the <211> closest to the bonding layer and thereby also closest to the $\alpha$-$Al_2O_3$ layer is believed to be advantageous in the strive to deposit a highly 001 oriented $\alpha$-$Al_2O_3$ layer. If the analysed area has a <211> direction within 15 degrees from the surface normal of the Ti(C,N) layer less than 93% the 001 orientation of the subsequent $\alpha$-$Al_2O_3$ layer will be less pronounced.

In one embodiment of the present invention the thickness of the portion B1 of the Ti(C,N) layer as measured in the growth direction of the coating is 0.5-1.5 μm, preferably 0.6-0.9 μm, most preferably 0.6-0.8 μm.

Fine grained Ti(C,N) is advantageous as a wear resistant layer, which could be due to its high amount of grain boundaries or due to a more smooth or even thickness of the layer. The portion of the TiCN layer that is fine grained should therefore be relatively thick. The coarse-grained portion that is to contribute with an increased adhesion is to be relatively limited, preferably 0.5-1.5 μm, more preferably 0.6-0.9 μm, most preferably 0.6-0.8 μm, in thickness of the portion B1. If the portion B1 is too thin the adhesion will not be enhanced.

In one embodiment of the present invention the bonding layer comprises at least one compound selected from the group of titanium carboxide, titanium oxynitride and titanium carboxynitride.

A bonding layer of titanium carboxide, titanium oxynitride or titanium carboxynitride is advantageous in that it can provide an epitaxial relation between the Ti(C,N) layer and the $\alpha$-$Al_2O_3$ layer.

In one embodiment of the present invention the grain size $D_{422}$ of Ti(C,N) is 25-40 nm, preferably 25-35 nm.

The present invention with increasing the adhesion between a fine grained Ti(C,N) and an $\alpha$-$Al_2O_3$ layer is especially advantageous for Ti(C,N) layers with very fine grains such as when grain size $D_{422}$ of Ti(C,N) is 25-40 nm, or even 25-35 nm.

In one embodiment of the present invention the Ti(C,N) layer exhibits an X-ray diffraction pattern, as measured using CuKα radiation and θ-2θ scan, wherein the TC(hkl) is defined according to Harris formula:

$$TC(hkl) = \frac{I(hkl)}{I_0(hkl)}\left[\frac{1}{n}\sum_{n=1}^{n}\frac{I(hkl)}{I_0(hkl)}\right]^{-1}$$

where I(hkl) is the measured intensity (integrated area) of the (hkl) reflection, I0(hkl) is the standard intensity according to ICDD's PDF-card No. 42-1489, n is the number of reflections, reflections used in the calculation are (1 1 1), (2 0 0), (2 2 0), (3 1 1), (3 3 1), (4 2 0) and (4 2 2), wherein TC(422)≥3, preferably ≥4.

In one embodiment of the present invention the $Al_2O_3$ layer is a $\alpha$-$Al_2O_3$ layer, preferably with an average thickness of the $\alpha$-$Al_2O_3$ layer is 1 μm-15 μm, preferably 3-10 μm.

In one embodiment of the present invention the layer, wherein said $\alpha$-$Al_2O_3$ layer exhibits a texture coefficient TC(hkl), as measured by X-ray diffraction using CuKα radiation and θ-2θ scan, defined according to Harris formula where I(hkl) is the measured intensity (integrated area) of the (hkl) reflection, I0(hkl) is the standard intensity according to ICDD's PDF-card No. 00-010-0173, n is the number of reflections used in the calculation, and where the (hkl) reflections used are (1 0 4), (1 1 0), (1 1 3), (0 2 4), (1 1 6), (2 1 4), (3 0 0) and (0 0 12) characterized in that TC(0 0 12)≥7.5, preferably ≥7.7, more preferably ≥7.8.

In one embodiment of the present invention the layer, wherein said $\alpha$-$Al_2O_3$ layer exhibits a TC(110)≤0.2, preferably ≤0.1.

In one embodiment of the present invention the Ti(C,N) grains in the portion B1 of Ti(C,N) layer has an average grain size of 130 nm-165 nm as measured with TKD in an analysed area of 5×5 μm on a plane view extending in parallel with the substrate surface. If the average grain size in portion B1 is too large the adhesion is still high, but it was found that the highest orientation of the subsequently deposited $\alpha$-$Al_2O_3$ layer could not be reached.

In one embodiment of the present invention said $\alpha$-$Al_2O_3$ layer in a portion O1 of the $\alpha$-$Al_2O_3$ layer, wherein the portion O1 extends 1 μm from the bonding layer, as measured with Electron Backscatter Diffraction (EBSD) on a cross section of said $\alpha$-$Al_2O_3$ layer and as measured as an average of at least 4 different areas with an area of analyses of at least 1×10 μm, wherein a surface normal of the $\alpha$-$Al_2O_3$ layer is parallel to the surface normal of the substrate surface, exhibits an orientation wherein 80% of the analysed area has a <001> direction within 15 degrees from the surface normal of the $\alpha$-$Al_2O_3$ layer, preferably ≥90%, more preferably ≥395%, most preferably ≥397%.

This high orientation of the $\alpha$-$Al_2O_3$ layer in the region O1, i.e. adjacent to the bonding layer in the lowermost part of the $\alpha$-$Al_2O_3$ layer, has shown to be unexpectedly advantageous in contributing to an increased resistance to first and secondary flank wear and also to increased crater wear in turning in steel.

In one embodiment of the present invention an average thickness of the Ti(C,N) layer is 4-20 μm, preferably 5-15 μm.

In one embodiment of the present invention an average thickness of the bonding layer is 0.25-2.5 μm, preferably 0.5-2.0 μm.

In one embodiment of the present invention an average thickness of the coating is 5.0 μm-30.0 μm, preferably 10-20 μm.

In one embodiment of the present invention said substrate is of cemented carbide, cermet or ceramic.

The atomic ratio of carbon to the sum of carbon and nitrogen (C/(C+N)) contained in the Ti(C,N) layer of the present invention is preferably 0.50-0.65, more preferably 0.55-0.62 as measured by electron microprobe analysis.

Still other objects and features of the present invention will become apparent from the following definitions and examples considered in conjunction with the accompanying drawings.

Definitions

The term "cutting tool" is herein intended to denote cutting tools suitable for metal cutting applications such as inserts, end mills or drills. The application areas can for example be turning, milling or drilling in metals such as steel.

Methods

Average Grain Size of Ti(C,N) Layer, $D_{422}$

In order to investigate the average grain size of the Ti(C,N) grains in the Ti(C,N) layer, X-ray diffraction (XRD) was conducted on the flank face using a PANalytical CubiX3 diffractometer equipped with a PIXcel detector. The coated cutting tool was mounted in sample holder to ensure that the flank face of the samples was parallel to the reference surface of the sample holder and also that the flank face was at appropriate height. Cu-Kα radiation was used for the measurements, with a voltage of 45 kV and a current of 40 mA. Anti-scatter slit of ½ degree and divergence slit of ¼ degree were used. The diffracted intensity from the coated cutting tool was measured in the 2θ range 20° to 140°, i.e. over an incident angle θ range from 10 to 70°. The data analysis, including background fitting, Cu-K$\alpha_2$ stripping and profile fitting of the data, was done using PANalytical's X'Pert HighScore Plus software.

The integrated peak full width at half maximum for the profile fitted curve achieved from PANalytical's X'Pert HighScore Plus software was used to calculate the grain size of the layer according to the Scherrer equation (Eq1) (Birkholz, 2006).

The average grain size $D_{422}$ is calculated from the full width at half maximum (FWHM) of the (422) peak according to Scherrer's equation:

$$D_{422} = \frac{K\lambda}{B_{422}\cos\theta} \tag{1}$$

wherein $D_{422}$ is the mean grain size of the Ti(C,N), K is the shape factor here set at 0.9, λ is the wave length for the CuK$\alpha_1$ radiation here set at 1.5405 Å, $B_{422}$ is the FWHM value for the (422) reflection and θ is the Bragg angle i.e the incident angle.

The obtained FWHM from the measurement contains both broadening from the instrument and broadening caused by the small grain size. To compensate for this a gaussian approximation was used (Birkholz, 2006). $B_{422}$ is the line broadening (in radians) at FWHM after subtracting the instrumental broadening (0.00174533 radians) and is defined in equation (2):

$$B_{422} = \sqrt{\left((FWHM_{obs})^2 - (FWHM_{ins})^2\right)} \tag{2}$$

where $B_{422}$ is the broadening (in radians) used for the grain size calculation, $FWHM_{obs}$ is the measured broadening (in radians), $FWHM_{ins}$ is the instrumental broadening (in radians). Since possible further layers above the Ti(C,N)-layer will affect the X-ray intensities entering the Ti(C,N)-layer and exiting the whole coating, corrections need to be made for these, taken into account the linear absorption coefficient for the respective compound in a layer. Alternatively, a further layer, above the Ti(C,N)-single-layer can be removed by a method that does not substantially influence the XRD measurement results, e.g. chemical etching.

Grain Size and Orientation of Portion B1 of Ti(C,N)

In the uppermost region of the Ti(C,N) layer, region B1, located closest to the bonding layer that is to bond the $Al_2O_3$ layer to the Ti(C,N) layer, the grains of the Ti(C,N) are enlarged to improve the adhesion. The average grain size of the Ti(C,N) grains in this area is analysed via a plan view of the region B1. This plan view is extending in a plane parallel with the surface of the substrate so the width of the columnar grains can be studied without any disturbance from for example of overlapping grains.

Samples for grain area analysis of the B1 area was produced by manufacturing a plan-view thin foil specimen of the area of interest by the FIB in-situ lift out technique (Langford & Clinton, 2004). The samples were extracted from polished cross-sections. A Helios Nanolab 650 using a Ga+ ion source was used for the sample preparation.

The area of interest was marked at the edge with a cross etched to the surface using a 79 pA ion current and 30 kV accelerating voltage to ensure that the exact area of interest was at the center of the specimen. The area was subsequently coated with an approximately 2 μm thick protective Pt-layer deposited using a 430 pA ion current and 30 kV accelerating voltage. After protective Pt-deposition the sample was prepared using the well-known in-situ lift out technique (Langford & Clinton, 2004).

The specimens were thinned down to <200 nm thickness to ensure electron transparency.

The grain size in B1 region was analysed using by transmission Kikuchi diffraction (TKD) in a Helios Nanolab 650, equipped with an Oxford-symmetry EBSD detector. 20 kV accelerating voltage and 13-26 nA beam current was used. Regions of at least 5×5 μm (at least 640 grains) were analysed with a step size of 10 nm, Speed 1 binning mode was used (622×512 pix). The average grain size (equivalent circle) was analysed using the Aztec Crystal software package (v 2.0), one auto-clean up using the Aztec Crystal software (v 2.0) was applied for a gentle noise reduction. The sample was analysed so that the surface of the specimen was parallel to the substrate surface, thus ensuring that the coating out of plane orientation was parallel to the sample normal. The grain detection threshold was set to 10° and an area of at least 40 pixels.

The orientation is determined as the amount in (%) of an analysed area that is within a certain angular deviation from a set axis. For the area B1 the <211> Ti(C,N) direction was chosen as the direction parallel to the surface normal. The orientation was calculated as the amount of analysed area that was ≤15° deviation from the <211> Ti(C,N) direction. The Aztec Crystal software (v 2.0) was used for the determination of the orientation.

The Ti(C,N), J.Electrochem. Soc. [JESOAN], (1950), vol 97, pp 299-304, reference pattern was used for the Ti(C,N) measurements, 89 reflectors were used for the measurements.

Orientation of Lowermost $Al_2O_3$—Portion O1

The portion of the $Al_2O_3$ layer that is close to the bonding layer is in this invention very highly oriented. To analyse this area a cross section of the coating was prepared and the $Al_2O_3$ grains in the portion O1, extending 1 μm in height from the bonding layer, was studied in detail by EBSD. The preparation of the polished cross-sections was performed by mounting each of the CNMG120408-PM inserts in a black conductive phenolic resin from AKASEL which were afterwards ground down about 1 mm and then polished in two steps: rough polishing (9 μm) and fine polishing (1 μm) using a diamond slurry solution. A final polish using colloidal silica solution was applied.

The orientation of the lowermost portion of the $Al_2O_3$ is determined as the amount in (%) of an analysed area that is within a certain angular deviation from a set axis. For the portion O1 the <001> $Al_2O_3$ direction was chosen as the direction parallel to the surface normal. The orientation was calculated as the amount of analysed area that was ≤15° deviation from the <001> $Al_2O_3$ direction.

Regions of at least 80 μm width was analysed with a step size of 50 nm, Speed 1 binning mode was used (622×512 pix). To analyse the orientation of O1 four rectangular shaped sections of O1 were randomly chosen along the interface sized to 10 μm wide and 1 μm in height. The orientation was calculated as the average of the four rectangular shaped sections. One auto-clean up step and one zero solution removal using the 5 nearest neighbors' level was applied to the data. The Aztec Crystal software (v 2.0) was used for the determination of the orientation.

The orientation of the O1 portion was analysed using a Zeiss Supra 55 and a Helios Nanolab 650, both equipped with Oxford-symmetry EBSD detectors. 20 kV accelerating voltage and 13-26 nA beam current was used. The samples were mounted on a 70° pre-tilted sample holder to ensure maximum collection efficiency.

The Alumina (Alpha), Acta Crystallogr, Sec B [ACB-CAR], vol 49B pp 973-980, reference pattern was used for the $Al_2O_3$ measurements, 89 reflectors were used for the measurements.

SEM Investigation

The SEM investigations of the polished cross sections and the sample top surfaces were carried out in a Carl Zeiss AG-Supra 40 type operated at 3 kV acceleration voltage using a 30 μm aperture size. The images were acquired using a secondary electron detector.

X-Ray Diffraction Measurement of Ti(C,N) and $Al_2O_3$

In order to investigate the texture of the whole layer(s), X-ray diffraction was conducted on the flank face of cutting tool inserts using a PANalytical CubiX3 diffractometer equipped with a PIXcel detector. The coated cutting tool insert was mounted in a sample holder to ensure that the flank face of the cutting tool insert was parallel to the reference surface of the sample holder and also that the flank face was at appropriate height. Cu-Kα radiation was used for the measurements, with a voltage of 45 kV and a current of 40 mA. Anti-scatter slit of ½ degree and divergence slit of ¼ degree were used. The diffracted intensity from the coated cutting tool was measured in the range 20° to 140° 2θ, i.e. over an incident angle θ range from 10 to 70°.

The data analysis, including background subtraction, Cu-$K_{\alpha 2}$ stripping and profile fitting of the data, was done using PANalytical's X'Pert HighScore Plus software. A general description of the fitting is made in the following. The output (integrated peak areas for the profile fitted curve) from this program was then used to calculate the texture coefficients of the layer by comparing the ratio of the measured intensity data to the standard intensity data according to a PDF-card of the specific layer (such as a layer of Ti(C,N) or α-$Al_2O_3$), using the Harris formula (3) as disclosed below. Since the layer is finitely thick the relative intensities of a pair of peaks at different 2θ angles are different than they are for bulk samples, due to the differences in path length through the layer. Therefore, thin film correction was applied to the extracted integrated peak area intensities for the profile fitted curve, taken into account also the linear absorption coefficient of layer, when calculating the TC values. Since possible further layers above for example the α-$Al_2O_3$ layer will affect the X-ray intensities entering the α-$Al_2O_3$ layer and exiting the whole coating, corrections need to be made for these as well, taken into account the linear absorption coefficient for the respective compound in a layer. The same applies for X-ray diffraction measurements of a Ti(C, N) layer if the Ti(C, N) layer is located below for example an α-$Al_2O_3$ layer. Alternatively, a further layer, such as TiN, above an alumina layer can be removed by a method that does not substantially influence the XRD measurement results, e.g. chemical etching.

In order to investigate the texture of the α-$Al_2O_3$ layer X-ray diffraction was conducted using $CuK_\alpha$ radiation and texture coefficients TC (hkl) for different growth directions of the columnar grains of the α-$Al_2O_3$ layer were calculated according to Harris formula (3):

$$TC(hkl) = \frac{I(hkl)}{I_0(hkl)}\left[\frac{1}{n}\sum_{n=1}^{n}\frac{I(hkl)}{I_0(hkl)}\right]^{-1} \quad (3)$$

where I(hkl)=measured (integrated area) intensity of the (hkl) reflection, $I_0$(hkl)=standard intensity according to ICDD's PDF-card no 00-010-0173, n=number of reflections to be used in the calculation. In this case the (hkl) reflections used are: (1 0 4), (1 1 0), (1 1 3), (0 2 4), (1 1 6), (2 1 4), (3 0 0) and (0 0 12). The measured integrated peak area is thin film corrected and corrected for any further layers above (i.e. on top of) the α-$Al_2O_3$ layer before said ratio is calculated.

The texture coefficients TC (hkl) for different growth directions of the columnar grains of the Ti(C,N) layer were calculated according to Harris formula (3) as disclosed earlier, where I(hkl) is the measured (integrated area) intensity of the (hkl) reflection, $I_0$(hkl) is the standard intensity according to ICDD's PDF-card no 42-1489, n is the number of reflections to be used in the calculation. In this case the (hkl) reflections used are (1 1 1), (2 0 0), (2 2 0), (3 1 1), (3 3 1), (4 2 0) and (4 2 2).

It is to be noted that peak overlap is a phenomenon that can occur in X-ray diffraction analysis of coatings comprising for example several crystalline layers and/or that are deposited on a substrate comprising crystalline phases, and this has to be considered and compensated for. An overlap of peaks from the α-$Al_2O_3$ layer with peaks from the Ti(C,N) layer might influence measurement and needs to be considered. It is also to be noted that for example WC in the substrate can have diffraction peaks close to the relevant peaks of the present invention.

BRIEF DESCRIPTION OF DRAWINGS

Embodiments of the invention will be described with reference to the accompanying drawings, wherein.

EXAMPLES

Figure 1:
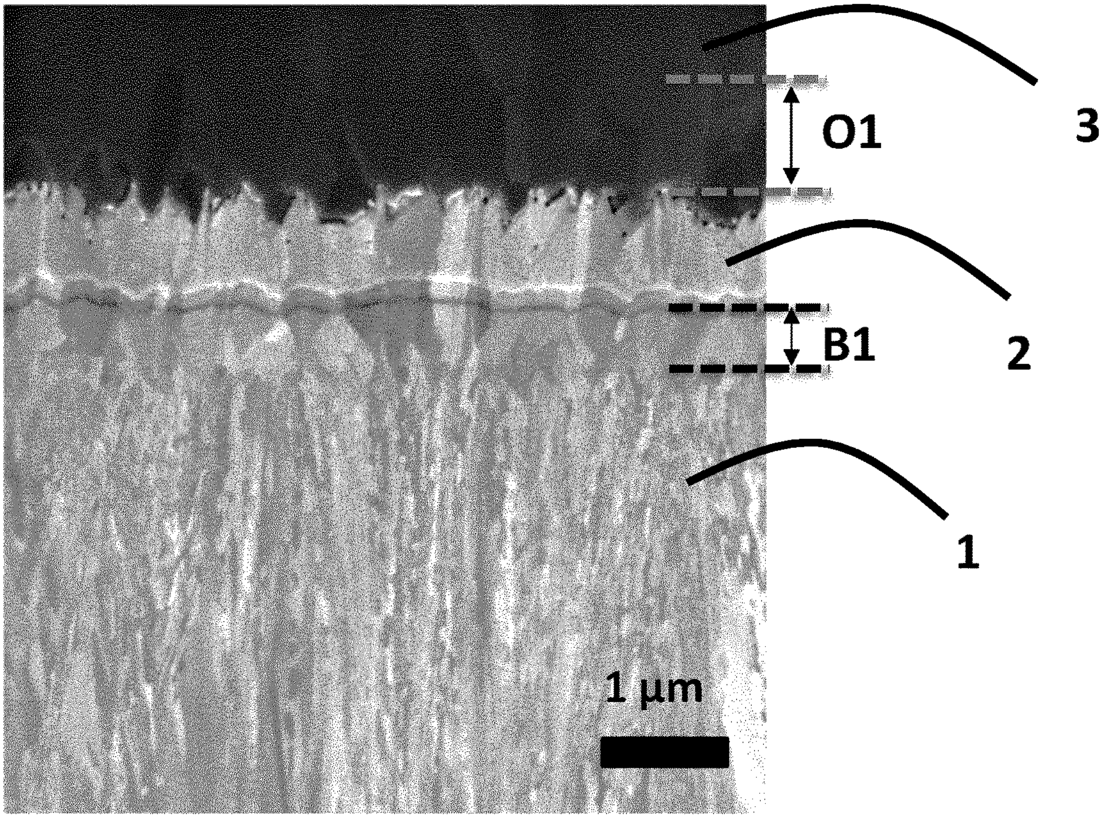
FIG. 1 shows a Scanning Electron Microscope (SEM) image of a cross section of an example of the inventive coating, Sample D, where the portion B1 of the Ti(C,N) layer (1), the bonding layer (2) and the portion O1 of the α-$Al_2O_3$ layer (3) are indicated.
Figure 2:
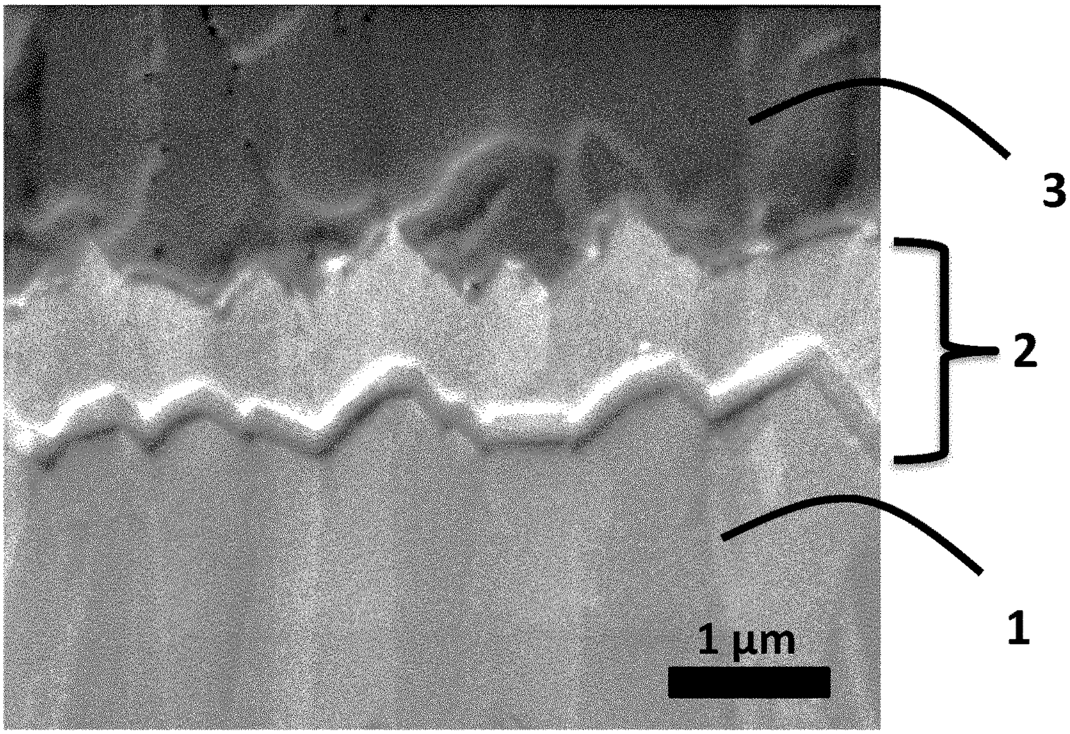
FIG. 2 shows a Scanning Electron Microscope (SEM) image of a cross section of an example of a reference coating, Sample A, where the uppermost Ti(C,N) (1), the bonding layer (2) and the lowermost α-$Al_2O_3$ (3) is visible.
Figure 3:
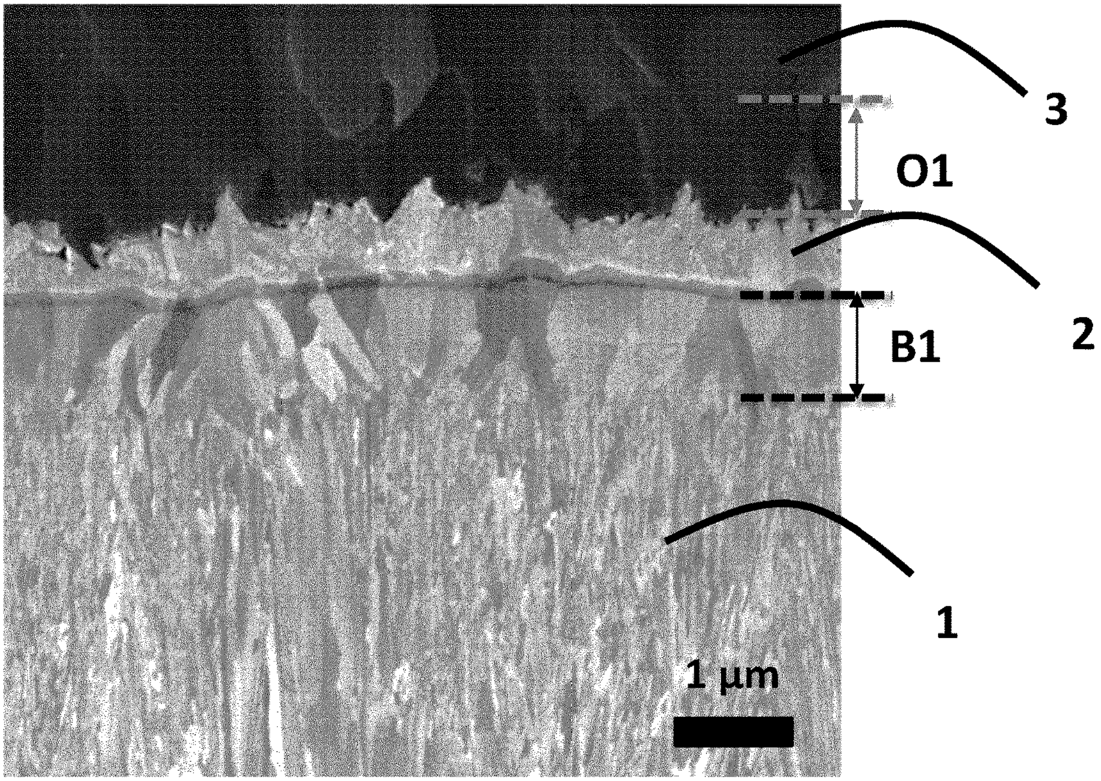
FIG. 3 shows a Scanning Electron Microscope (SEM) image of a cross section of an example of an inventive coating, Sample G, where the portion B1 of the Ti(C,N) layer (1), the bonding layer (2) and the portion O1 of the α-$Al_2O_3$ layer (3) are indicated.
Figure 4:
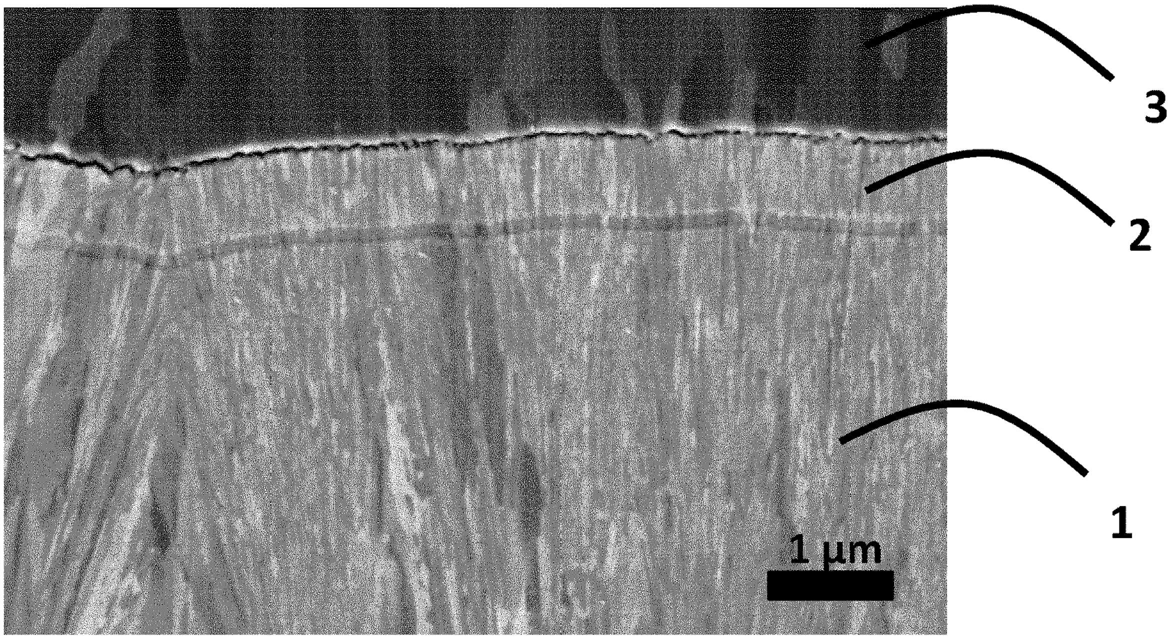
FIG. 4 shows a Scanning Electron Microscope (SEM) image of a cross section of an example of a reference coating, Sample B, where the uppermost Ti(C,N) (1), the bonding layer (2) and the lowermost α-$Al_2O_3$ (3) is visible.
Figure 5:
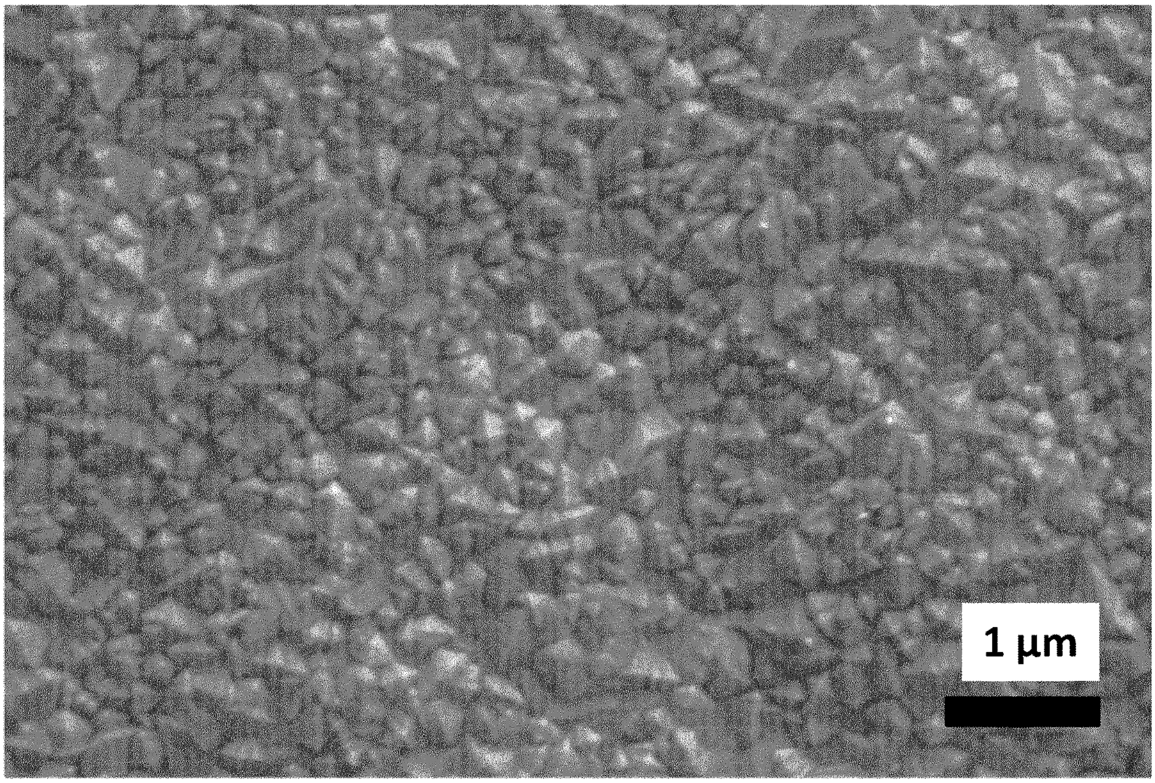
FIG. 5 shows a Scanning Electron Microscope (SEM) image of a top surface of portion B1 of a sample provided with a Ti(C,N) layer corresponding to the Ti(C,N) in sample D where the morphology of the outermost surface of the portion B1 is visible.
Figure 6:
FIG. 6 shows a Scanning Electron Microscope (SEM) image of a top surface of the Ti(C,N) layer of a sample provided with a Ti(C,N) layer corresponding to the Ti(C,N) in sample B where the morphology of the outermost surface of the very fine grained Ti(C,N) is visible.
Figure 7:
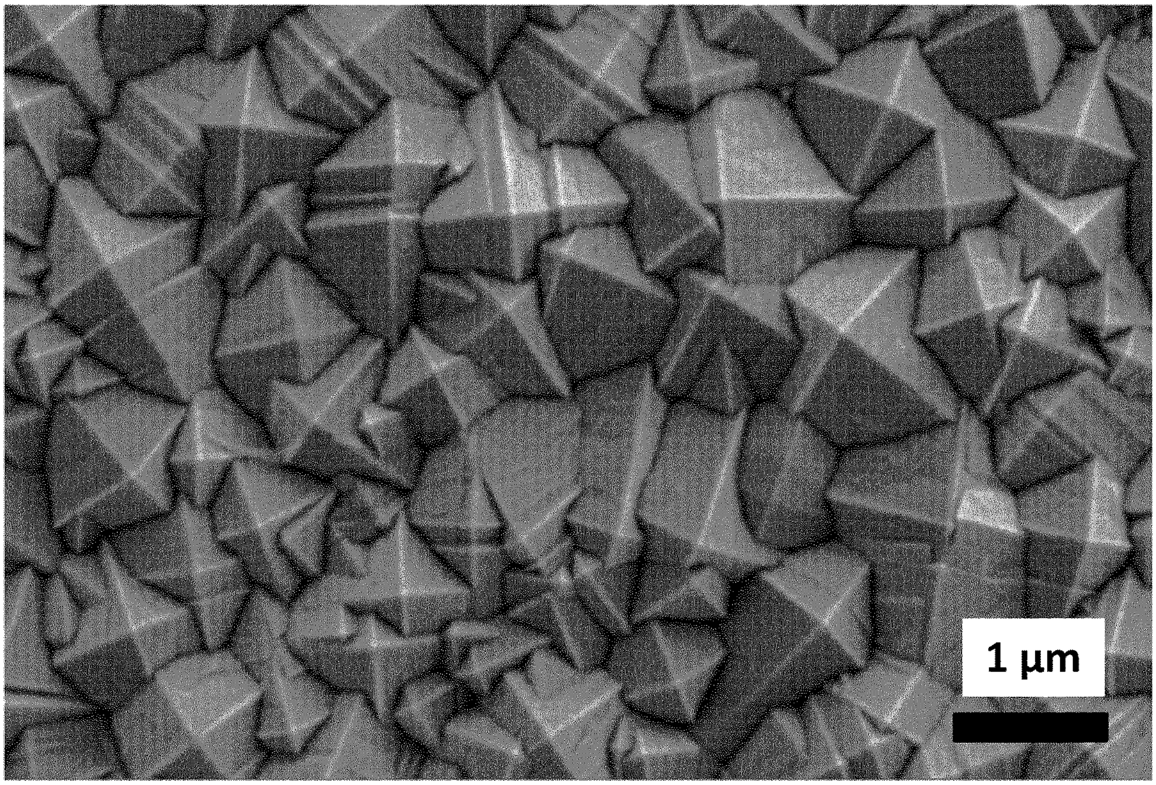
FIG. 7 shows a Scanning Electron Microscope (SEM) image of a top surface of the Ti(C,N) layer of a sample provided with a Ti(C,N) layer corresponding to the Ti(C,N) in the reference sample A where the morphology of the outermost surface of the coarse grained Ti(C,N) is visible.
Figure 8:
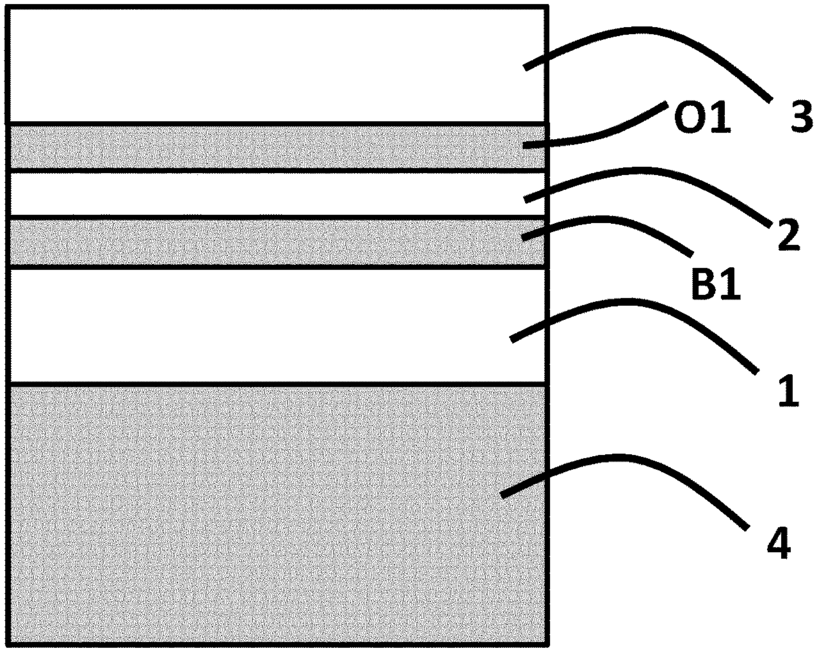
FIG. 8 is a schematic overview showing the position of the layers and portions of the present invention, the Ti(C,N) layer (1), the portion B1 of the Ti(C,N) layer (1), the bonding layer (2), the α-$Al_2O_3$ layer (3), the portion O1 of the α-$Al_2O_3$ layer (3) and the substrate (4)
Figure 9:
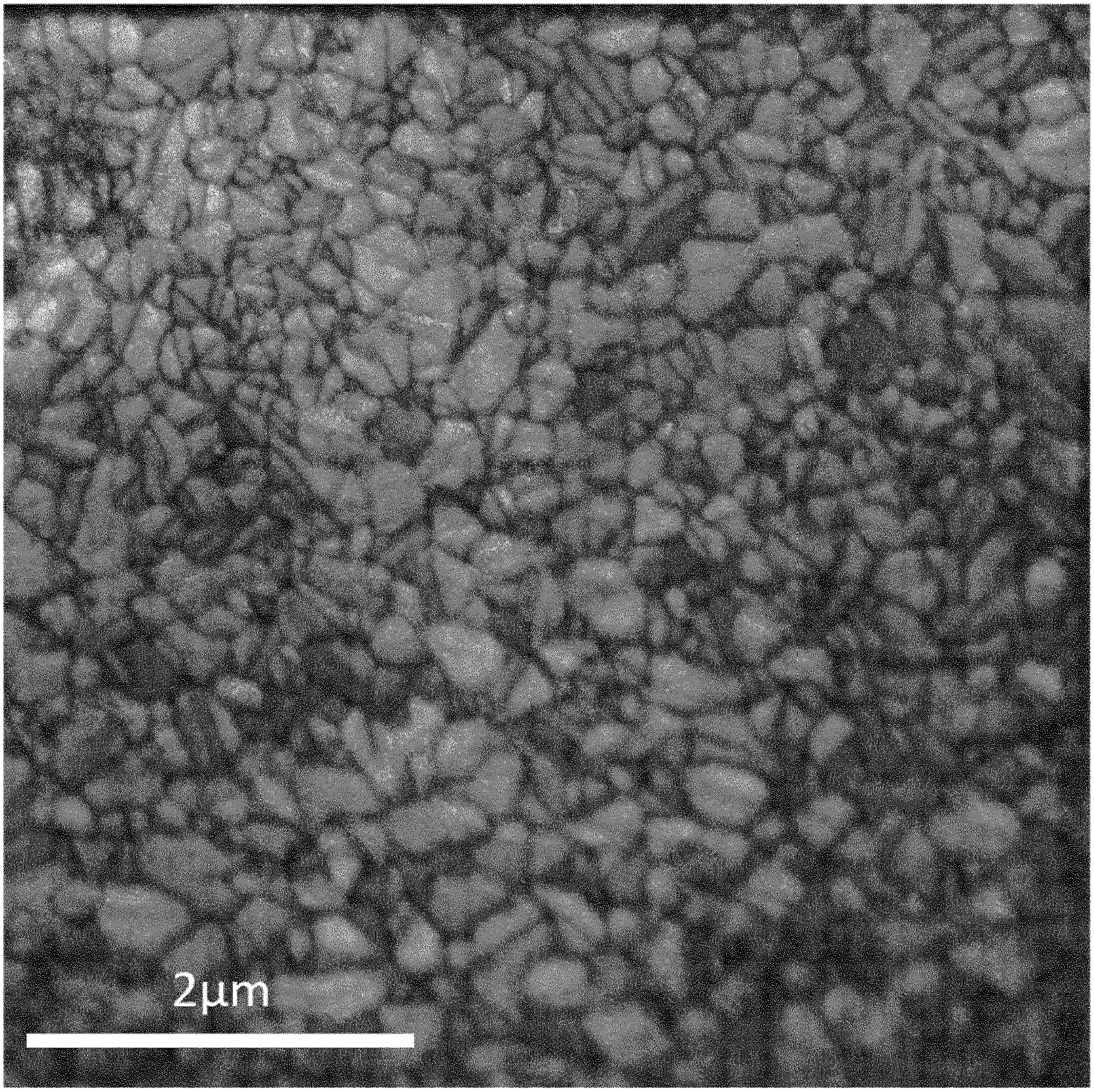
FIG. 9 is a band contrast TKD image of a plan view of sample D where Ti(C,N) grains in the B1 portion are visible.

Exemplifying embodiments of the present invention will now be disclosed in more detail and compared to reference embodiments. Coated cutting tools (inserts) were manufactured, analysed and tested in cutting tests.

Cemented carbide substrates were manufactured utilizing conventional processes including milling, mixing, spray drying, pressing and sintering. The ISO-type geometry of the cemented carbide substrates (inserts) was CNMG-120408-PM. The composition of the cemented carbide was 7.2 wt % Co, 2.9 wt % TaC, 0.5 wt % NbC, 1.9 wt % TiC, 0.4 wt % TiN and the rest WC.

Before the coating depositions the substrates were exposed to a mild blasting treatment to remove any residuals on the substrate surfaces from the sintering process.

CVD Depositions

The sintered substrates were CVD coated in a radial CVD reactor of lonbond Type size 530 capable of housing 10.000 half inch size cutting inserts. The samples to be tested and analysed further were selected from the middle of the chamber and at a position along half the radius of the plate between the center and the periphery of the plate. Mass flow controllers were chosen so that the high flow of for example $CH_3CN$ could be set.

A first innermost coating of about 0.2 μm TiN was deposited on all substrates in a process at 400 mbar and 885° C. A gas mixture of 48.8 vol % $H_2$, 48.8 vol % $N_2$ and 2.4 vol % $TiCl_4$ was used.

Thereafter followed the Ti(C,N) layer deposition, and all samples A-G were deposited with different Ti(C,N) in accordance with the following. The reference sample A was deposited with the process steps V and W as shown in Table 1. The temperature adjustment from 885° C. to 870° C. before starting with process step X for the samples B-G was made in 50 vol % $H_2$ and 50 vol % $N_2$ at 80 mbar. The Ti(C,N) layer of reference sample B was deposited with the process step X as shown in Table 1. On samples C-G the Ti(C,N) layers were deposited with the process steps X, Y and Z using the deposition times as indicated in Tables 1 and 2. The process times were adjusted to reach about the same total Ti(C,N) layer thickness for all the samples.

TABLE 1

| Parameter | Process step X | Process step Y | Process step Z | Process step V | Process step W |
|---|---|---|---|---|---|
| $H_2$ | Balance | Balance | Balance | Balance | Balance |
| $N_2$ | | 42.97% | 7.76% | 37.57% | 7.76% |
| $TiCl_4$ | 2.95% | 1.17% | 2.38% | 2.95% | 2.38% |
| $CH_3CN$ | 0.45% | 2.08% | 0.65% | 0.45% | 0.65% |
| HCl | | 10.82% | 7.76% | | 7.76% |
| Total gas flow [l/h] | 5600 | 3421 | 7734 | 5590 | 7734 |
| Pressure [mbar] | 80 | 70 | 70 | 55 | 55 |
| Temperature [° C.] | 870 | 870 | 870 | 885 | 885 |
| Process time [min] | See Table 2 | | 15 | 10 | 270 |

TABLE 2

| Sample | Process step X [minutes] | Process step Y [minutes] |
|---|---|---|
| B | 260 | — |
| C | 243 | 5 |
| D | 240 | 15 |
| E | 238 | 20 |
| F | 235 | 30 |
| G | 230 | 45 |

A 0.7-0.9 μm thick bonding layer was deposited at 100000 on top of the Ti(C,N) layer by a process consisting of four separate reaction steps. First a 8 minutes HTCVD Ti(C,N) step using $TiCl_4$, $OH_4$, $N_2$, HCl and $H_2$ at 400 mbar, then a second step (Ti(C,N,O)−1) using $TiCl_4$, $CH_3CN$, CO, $N_2$ and $H_2$ at 70 mbar for 7 minutes, then a third step (Ti(C,N,O)−2) using $TiCl_4$, $CH_3CN$, CO, $N_2$ and $H_2$ at 70 mbar for 5 minutes and finally a fourth step (TiN) using $TiCl_4$, $N_2$ and $H_2$ at 70 mbar for 6 minutes. During the third deposition step the CO gas flow was continuously linearly increased from a start value to a stop value as shown in Table 3. All other gas flows were kept constant, but since the overall gas flow is increased, the concentration of all gases were somewhat influenced due to this. Prior to the start of the subsequent $Al_2O_3$ nucleation, the bonding layer was oxidized for 4 minutes in a mixture of $CO_2$, CO, $N_2$ and $H_2$.

The details of the bonding layer deposition are shown in Table 3.

TABLE 3

| Bonding layer deposition | | | | | | | | | |
|---|---|---|---|---|---|---|---|---|---|
| Bonding layer | Pressure [mbar] | $H_2$ [vol %] | $N_2$ [vol %] | $CH_4$ [vol %] | HCl [vol %] | CO [vol %] | $TiCl_4$ [vol %] | $CH_3CN$ [vol %] | $CO_2$ [vol %] |
| Temp. increase | 55 | Balance | 25 | | | | | | |
| HTCVD Ti(C, N) | 400 | Balance | 25.5 | 3.4 | 1.7 | — | 1.55 | — | — |
| Ti(C, N, O)-1 | 70 | Balance | 12.0 | — | 1.2 | 1.2 | 1.5 | 0.40 | — |
| Ti(C, N, O)-2 | 70 | Balance | 31.5-30.6 | — | — | 1.6-4.6 | 3.15-3.06 | 0.65-0.63 | — |
| TiN | 70 | Balance | 32.3 | — | — | — | 3.23 | — | — |
| Oxidation | 55 | Balance | 30 | — | — | 12.5 | — | — | 3.7 |

On top of the bonding layer an α-$Al_2O_3$ layer was deposited. All the α-$Al_2O_3$ layers were deposited at 1000° and 55 mbar in two steps. The first step using 1.2 vol-% $AlCl_3$, 4.7 vol-% $CO_2$, 1.8 vol-% HCl and balance $H_2$ giving about 0.1 μm α-$Al_2O_3$ and a second step as disclosed below giving a total α-$Al_2O_3$ layer thickness of about 5 μm. The second step of the α-$Al_2O_3$ layer was deposited using 1.16% $AlCl_3$, 4.65% $CO_2$, 2.91% HCl, 0.58% $H_2S$ and balance $H_2$.

Coating Analysis

The layer thicknesses were measured on the rake face of the cutting tool samples using a Scanning Electron Microscope. The layer thicknesses of the coating the samples A-G are shown in Table 4.

TABLE 4

Layer thicknesses

| Sample | TiN + Ti(C, N) + bonding layer thickness [μm] | Process times of steps Y/Z [min/min] | Thickness portion from step Y [μm] | Thickness portion from step Z [μm] | Thickness portion B1 [μm] | $Al_2O_3$ thickness [μm] |
|---|---|---|---|---|---|---|
| A | 10.4 | 0/0 | — | — | — | 5.0 |
| B | 8.7 | 0/0 | — | — | — | 4.5 |
| C | 9.4 | 5/15 | ≈0.1 | ≈0.4 | ≈0.5 | 4.3 |
| D | 9.2 | 15/15 | ≈0.2 | ≈0.5 | ≈0.7 | 4.6 |
| E | 8.7 | 20/15 | ≈0.3 | ≈0.4 | ≈0.7 | 4.8 |
| F | 9.4 | 30/15 | ≈0.5 | ≈0.4 | ≈0.9 | 5.3 |
| G | 8.7 | 45/15 | ≈0.5 | ≈0.4 | ≈0.9 | 4.2 |

The grain size of the Ti(C,N) layers were analysed both as an average in the whole Ti(C,N) layer and in the portion B1 close to the bonding layer. The results are presented in Table 5.

The orientation of the Ti(C,N) grains in the portion B1 of the Ti(C,N) layer and the orientation of the α-$Al_2O_3$ grains in the O1 portion of the α-$Al_2O_3$ layer were analysed. The results are presented in Table 5.

The grain size of the Ti(C,N) layer in the reference sample A was too large to be analysed with XRD, and the Scherrer's equation is not considered valid for grain sizes larger than about 0.2 μm. The average grain size of this layer is larger than 200 nm as measured in a cross section SEM image

TABLE 5

Grain sizes and orientations of the portions O1 and B1.

| Sample | Average grain size $D_{422}$ in Ti(C, N) layer [nm] | Average grain size in B1 of Ti(C, N) [nm] | Orientation in portion B1 in Ti(C, N), ≤15° from <211> [%] | Orientation in portion O1 α-$Al_2O_3$, ≤15% from <001> [%] |
|---|---|---|---|---|
| A | n.a | no B1 portion | no B1 portion | n.a. |
| B | 31 | no B1 portion | no B1 portion | 94.8 |
| C | 28 | 115 | 91.7% | 96.18 |
| D | 27 | 146 | 98.5% | 98.3 |
| E | 27 | 157 | 96.6% | 90.0 |
| F | 29 | 208 | 76.6% | 70.4 |
| G | 27 | 168 | 85.3% | 78.9 |

(n.a. = not analysed)

Texture coefficients of the Ti(C,N) and the α-$Al_2O_3$ layers were analysed using X-ray diffraction and the results are presented in Table 6 and Table 7.

TABLE 6

| Texture coefficients for the $\alpha$-$Al_2O_3$ layer in the samples | | | | | | | | |
|---|---|---|---|---|---|---|---|---|
| Sample | TC(104) | TC(110) | TC(113) | TC(024) | TC(116) | TC(214) | TC(300) | TC(0012) |
| A | 0.02 | 0.25 | 0.01 | 0.07 | 0.01 | 0.03 | 0.00 | 7.61 |
| B | 0.00 | 0.01 | 0.00 | 0.00 | 0.00 | 0.00 | 0.00 | 7.99 |
| C | 0.02 | 0.03 | 0.00 | 0.01 | 0.01 | 0.00 | 0.00 | 7.94 |
| D | 0.01 | 0.07 | 0.00 | 0.02 | 0.00 | 0.00 | 0.00 | 7.89 |
| E | 0.01 | 0.08 | 0.00 | 0.02 | 0.01 | 0.00 | 0.00 | 7.89 |
| F | 0.09 | 0.09 | 0.00 | 0.03 | 0.06 | 0.01 | 0.01 | 7.70 |
| G | 0.03 | 0.17 | 0.00 | 0.05 | 0.03 | 0.01 | 0.00 | 7.72 |

TABLE 7

| Texture coefficient TC(422) for the Ti(C, N) layer in the samples | |
|---|---|
| Sample | TC(422) |
| A | 3.94 |
| B | 3.95 |
| C | 3.43 |
| D | 4.14 |
| E | 4.06 |
| F | 3.19 |
| G | 3.74 |

Performance Tests

The as coated cutting tools were tested in two parallel cutting tests, Cutting test 1 and Cutting test 2, in a longitudinal turning operation in a work piece material Ovako 825B (100CrMo7-3), a high alloyed steel. The cutting speed, Vc, was 220 in/min, the feed, fn, was 0.3 mm/revolution, the depth of cut was 2 mm and water miscible cutting fluid was used. The machining was continued until the end of lifetime criterion was reached. One cutting edge per cutting tool was evaluated.

The tool life criterion was considered reached when the primary or secondary flank wear was >0.3 mm or when the crater area (exposed substrate) was >0.2 $mm^2$. As soon as any of these criteria were met the lifetime of the sample was considered reached. The result of the cutting test is presented in Table 8 and 9.

TABLE 8

| Cutting test 1 | | | |
|---|---|---|---|
| | Flank wear after 30 minutes | | |
| Sample | Primary flank wear [mm] | Secondary flank wear [mm] | Crater wear after 40 minutes Crater area [$mm^2$] |
| A | 0.26 | 0.25 | 0.13 |
| C | 0.25 | 0.24 | 0 |
| D | 0.27 | 0.22 | 0 |
| E | 0.24 | 0.21 | 0 |
| F | 0.29 | 0.27 | 0.04 |
| G | 0.28 | 0.24 | 0.07 |

TABLE 9

| Cutting test 2 | | |
|---|---|---|
| Sample | Time in cut until lifetime [min.] | Lifetime reached due to |
| A | 54 | Crater wear >0.2 |
| D | 86 | Crater wear >0.2 |
| E | 82 | Crater wear >0.2 |

As can be seen in the table 8 all the samples C, D, E, F and G showed a high wear resistance. As shown in table 9 the samples D and E shows a high resistance to both flank and crater wear in metal cutting of steel, also compared with the reference sample A which is a very high performing reference sample.

The cutting tools were also evaluated by being exposed to an abrasive wet blasting. The blasting was performed on the rake faces of the cutting tools. The blaster slurry consisted of 20 vol-% alumina in water and an angle of 90° between the rake face of the cutting insert and the direction of the blaster slurry. The distance between the gun nozzle and the surface of the insert was about 145 mm. The pressure of the slurry to the gun was 1.8 bar for all samples, while the pressure of air to the gun was 2.2 bar. The alumina grits were F230 mesh (FEPA 42-2:2006). The average time for blasting per area unit was 4.4 seconds. Samples B and C could not withstand the wet blasting, the coating of sample B showed severe flaking, the sample C showed spot wise flaking. All the other samples did withstand the wet blasting without destroying the coatings.

While the invention has been described in connection with various exemplary embodiments, it is to be understood that the invention is not to be limited to the disclosed exemplary embodiments, on the contrary, it is intended to cover various modifications and equivalent arrangements within the appended claims. Furthermore, it should be recognized that any disclosed form or embodiment of the invention may be incorporated in any other disclosed or described or suggested form or embodiment as a general matter of design choice. It is the intention, therefore, to be limited only as indicated by the scope of the appended claims appended hereto.

The invention claimed is:

1. A cutting tool comprising a substrate at least partially coated with a coating, said coating comprising a layer of Ti(C,N), a layer of $Al_2O_3$ and there between a bonding layer, wherein said Ti(C,N) layer having a thickness of 3-25 μm is composed of columnar grains, wherein an average grain size $D_{422}$ of the Ti(C,N) layer is 25-50 nm, as measured with X-ray diffraction with CuK$\alpha$ radiation, the grain size $D_{422}$ is calculated from the full width at half maximum (FWHM) of the (422) peak according to Scherrer's equation:

$$D_{422} = \frac{K\lambda}{B_{422}\cos\theta}$$

wherein $D_{422}$ is the average grain size of the Ti(C,N), K is the shape factor here set at 0.9, λ is the wave length for the CuKα radiation here set at 1.5405 Å, $B_{422}$ is the FWHM value for the reflection and θ is the Bragg angle, and wherein the Ti(C,N) layer includes a portion $B_1$ that is adjacent to the bonding layer, and wherein an average grain size of the Ti(C,N) grains in portion B1 is larger than the average grain size $D_{422}$ over the whole thickness of the Ti(C,N) layer, in the portion B1 of Ti(C,N) layer the Ti(C,N) grains has an average grain size of 130-300 nm as measured with Transmission Kikuchi Diffraction (TKD) on a plane view of the portion B1 of the Ti(C,N) layer extending in parallel with the substrate surface.

2. The cutting tool according to claim 1, wherein the Ti(C,N) layer in the portion B1 of the Ti(C,N) layer exhibits an orientation as measured with TKD on a plan view extending in parallel with a surface of the substrate, wherein a surface normal of the Ti(C,N) layer is parallel to a surface normal of the substrate surface, wherein ≥93%, of the analysed area has a <211> direction within 15 degrees from the surface normal of the Ti(C,N) layer.

3. The cutting tool according to claim 1, wherein thickness of the portion B1 of the Ti(C,N) layer is 0.5-1.5 μm.

4. The cutting tool according to claim 1, wherein the bonding layer includes at least one compound selected from the group of titanium carboxide, titanium oxynitride and titanium carboxynitride.

5. The cutting tool according to claim 1, wherein the grain size $D_{422}$ of Ti(C,N) is 25-40 nm.

6. The cutting tool according to claim 1, wherein the Ti(C,N) layer exhibits an X-ray diffraction pattern, as measured using CuKα radiation and θ-2θ scan, wherein the TC(hkl) is defined according to Harris formula:

$$TC(hkl) = \frac{I(hkl)}{I_0(hkl)}\left[\frac{1}{n}\sum_{n=1}^{n}\frac{I(hkl)}{I_0(hkl)}\right]^{-1}$$

where I(hkl) is the measured intensity (integrated area) of the (hkl) reflection, $I_0$(hkl) is the standard intensity according to ICDD's PDF-card No. 42-1489, n is the number of reflections, reflections used in the calculation are (1 1 1), (2 0 0), (2 20), (3 1 1), (3 3 1), (4 2 0) and (4 2 2), wherein TC(422)≥3.

7. The cutting tool according to claim 1, wherein the $Al_2O_3$ layer is a α-$Al_2O_3$ layer with an average thickness of 1 μm-15 μm.

8. The cutting tool according to claim 7, wherein the α-$Al_2O_3$ layer exhibits a texture coefficient TC(hkl), as measured by X-ray diffraction using CuKα radiation and θ-2θ scan, defined according to Harris formula where I(hkl) is the measured intensity (integrated area) of the (hkl) reflection, $I_0$(hkl) is the standard intensity according to ICDD's PDF-card No. 00-010-0173, n is the number of reflections used in the calculation, and where the (hkl) reflections used are (1 0 4), (1 1 0), (1 1 3), (0 2 4), (1 1 6), (2 1 4), (3 0 0) and (0 0 12) characterized in that TC(0 0 12)≥7.5.

9. The cutting tool according to claim 7, wherein said α-$Al_2O_3$ layer exhibits a texture coefficient TC(110)≤0.2.

10. The cutting tool according to claim 1, wherein in the portion B1 of Ti(C,N) layer the Ti(C,N) grains has an average grain size of 130 nm-165 nm as measured with TKD on a plane view extending in parallel with the substrate surface.

11. The cutting tool according to claim 7, wherein said α-$Al_2O_3$ layer includes a portion O1 extending 1 μm from the bonding layer, wherein said portion O1 as measured with Electron Backscatter Diffraction (EBSD) on a cross section of said α-$Al_2O_3$ layer, wherein a surface normal of the α-$Al_2O_3$ layer is parallel to the surface normal of the substrate surface, exhibits an orientation wherein ≥80%, of the analysed area has a <001> direction within 15 degrees from the surface normal of the α-$Al_2O_3$ layer.

12. The cutting tool according to claim 1, wherein an average thickness of the Ti(C,N) layer is 4-20 μm.

13. The cutting tool according to claim 1, wherein an average thickness of the bonding layer is 0.25-2.5 μm.

14. The cutting tool according to claim 1, wherein an average thickness of the coating is 5.0 μm-30.0 μm.

15. The cutting tool according to claim 1, wherein said substrate is a cemented carbide, cermet or ceramic.

* * * * *